United States Patent
Rao

Patent Number: 6,018,793
Date of Patent: Jan. 25, 2000

[54] SINGLE CHIP CONTROLLER-MEMORY DEVICE INCLUDING FEATURE-SELECTABLE BANK I/O AND ARCHITECTURE AND METHODS SUITABLE FOR IMPLEMENTING THE SAME

[75] Inventor: G. R. Mohan Rao, Dallas, Tex.

[73] Assignee: Cirrus Logic, Inc.

[21] Appl. No.: 08/957,242

[22] Filed: Oct. 24, 1997

[51] Int. Cl.[7] ................................. G06F 13/16
[52] U.S. Cl. ........................... 711/150; 711/104
[58] Field of Search ................... 711/104, 147, 711/149, 150; 365/230.05, 230.09

[56] References Cited

U.S. PATENT DOCUMENTS

| | | | |
|---|---|---|---|
| 5,226,142 | 7/1993 | Vegesna et al. | 365/230.02 |
| 5,305,253 | 4/1994 | Ward | 365/73 |
| 5,355,335 | 10/1994 | Katsuno | 365/189.04 |
| 5,854,637 | 12/1998 | Sturges | 345/512 |

*Primary Examiner*—Eddie P. Chan
*Assistant Examiner*—Kevin L. Ellis
*Attorney, Agent, or Firm*—James J. Murphy, Esq.; Steve Shaw

[57] ABSTRACT

A memory architecture 104 includes a plurality of arrays 200 of memory cells. Addressing circuitry 201 selects a cell of a selected one of arrays 201 for access while feature select circuitry 205 selects an access type to be performed to the selected cell. A first bus 207, 208, 209 exchanges a bit of data with the selected cell in response to the selection of a first access type. A second bus 207, 208, 209 exchanges a bit of data with the selected cell in response to the selection of a second access type.

18 Claims, 1 Drawing Sheet

SINGLE CHIP CONTROLLER-MEMORY DEVICE INCLUDING FEATURE-SELECTABLE BANK I/O AND ARCHITECTURE AND METHODS SUITABLE FOR IMPLEMENTING THE SAME

TECHNICAL FIELD OF THE INVENTION

The present invention relates in general to digital electronic circuits and systems and in particular to a single ship controller-memory device including feature selectable bank I/O and a memory architecture suitable for implementing the same.

BACKGROUND OF THE INVENTION

A typical processing system with video/graphics display capability includes a central processing unit (CPU), a display controller coupled with the CPU by a system bus, a system memory also coupled to the system bus, a frame buffer coupled to the display controller by a local bus, peripheral circuitry (e.g., clock drivers and signal converters), display driver circuitry, and a display unit. The CPU generally provides overall system control and, in response to user commands and program instructions retrieved from the system memory, controls the contents of graphics images to be displayed on the display unit. The display controller, which may for example be a video graphics architecture (VGA) controller, generally interfaces the CPU and the display driver circuitry, exchanges graphics and/or video data with the frame buffer during data processing and display refresh operations, controls frame buffer memory operations, and performs additional processing on the subject graphics or video data, such as color expansion. The display driver circuitry converts digital data received from the display controller into the analog levels required by the display unit to generate graphics/video display images. The display unit may be any type of device which presents images to the user conveying the information represented by the graphics/video data being processed. The "display" may also be a printer or other document view/print appliance.

The frame buffer stores words of graphics or video data defining the color/gray-shade of each pixel of an entire display frame during processing operations such as filtering or drawing images. During display refresh, this "pixel data" is retrieved out of the frame buffer by the display controller pixel by pixel as the corresponding pixels on the display screen are refreshed. Thus, the size of the frame buffer directly corresponds to the number of pixels in each display frame and the number of bits (Bytes) in each work used to define each pixel. In a standard VGA system, each frame consists of 640 columns and 480 rows of pixels and each pixel is defined by 8 bits, the frame buffer must have a minimum capacity of 307,200 Bytes. For larger displays, such as a 1280 by 1024 display, approximately 1.5 MBytes or more of memory space is required. It should be recognized that the size and performance of frame buffer 104 is dictated by a number of factors such as, the number of monitor pixels, the monitor DOT clock rate, display refresh, data read/write frequency, and memory bandwidth, to name only a few.

Most frame buffers are constructed from random access memory devices (RAMs). Currently available RAM devices unfortunately have limitations on their use, mostly as a result of trade-offs that had to be made during their design and fabrication. Primarily due to expense and fabrication yields, RAM manufacturers are limited in the number of storage locations (cells) which can be provided on a single integrated circuit. Further, design tradeoffs must be made in the interests of minimizing the number of data and address pins, minimizing the number of devices required for a given memory system, and of optimizing the width of the data and address ports. For example, a 4 Mbit (0.5 Mbyte) RAM can be arranged as 4 M×1 (i.e. storing 4 million 1-bit words), 1 M×4, 512 K×8, 256 K×16, or 128 K×32 (storing 128 thousand 32-bit words) device. At the one extreme, the 4 M×1 architecture only allows access to a single bit per address thereby necessitating the use of 32 devices to completely service a 32-bit data bus. This construction disadvantageously consumes valuable board space. At the other extreme, a single 128 K×32 device can service a 32-bit bus however the overall word storage capacity is relatively small and each chip/package requires 32 data pins alone along with 17 additional address pins (not to mention power, control, and feature pins). The need for a total of 39 data and address pins increases the size of the chip (as well as its package) due to minimum size requirements on each connection between the chip and its package and the need for level translator (driver) circuits to drive each such connection. As a consequence, RAM manufacturers have generally adopted the more practical architectures, such as the 256 K×16 architecture. Even with the 256 K×16 architecture however two devices are still required to service a 32-bit bus (or four to service a 64-bit bus) and each device still requires 18 address and 16 data pins for a 256 K deep memory (which is very limited).

Proposals have been put forth to put not only the entire frame buffer on a single chip but to also add the controller to the chip. A single controller/memory device would reduce the required board space and would eliminate the need for interconnection pins entirely. The primary obstacle to implementing these proposals has been the inability to solve the problem of achieving good yield during the chip manufacturing process. A state-of-the-art controller is normally fabricated using random logic circuitry which results in a typical die sort (fabrication) yield of 60–70%. Random logic circuitry is generally not "repairable." A memory however is usually fabricated as an array of rows and columns of memory cells. The repetitive nature of memory arrays allows for columns and rows containing defective cells to be "repaired" by substitution with redundant rows and columns provided on the chip. With the ability to "repair", the yield for memory devices can be increased. Typically however no more than 2–3% of a given array are provided as "repair cells" due to cost limitations. Further, in those cases where the memory cells are divided into blocks, the repair cells are typically not transferable from block to block. Therefore, a substantial number of defects in a block of memory cells normally cannot be repaired even if enough repair cells are available in the overall array. Currently, there are no means for accessing only the remaining operational blocks of the memory and thus the entire chip must be discarded in many cases.

Conventional RAMs (dynamic RAMs) also disadvantageously employ a multiplexed addressing system. During a memory access, row address bits are sent to each DRAM on the address bus and latched into each device address decoder in response to a row address strobe (/RAS). The column address bits and column address strobe (/CAS) are then presented to each DRAM and latched into the corresponding address decoders, after which data can be written to or retrieved from the addressed locations in memory. Besides complicating the timing of the system memory addressing scheme, this process takes two master clocks instead of a single master clock.

Increasingly, controller-memory subsystems are being required to handle multiple types or formats of data simultaneously. For example, a user interface may include a visual display and an audio subsystem. The visual display output may alone be composed of various combinations of different types of display data such as text JPEG, MPEG, and 3D graphics, to name a few possibilities. For each type of display data, the processing and hence supporting memory storage operations will differ substantially. The same is true for audio data, where various types of compressed or formatted data may be processed and mixed into a composite output.

Thus, the need has arisen for an architecture which will allow the fabrication of a controller and associated memory as a single integrated circuit with high yields and thus reduced device cost. In particular, such an integrated device should allow for the processing and storage of different types of data concurrently. Further, in doing so, the device should provide for high bandwidth operation when included in a general or special purpose computing system. Such an architecture should be applicable to memories of differing sizes and an output word arrangements.

SUMMARY OF THE INVENTION

According to one embodiment of the principles of the present invention, a memory architecture is disclosed including a plurality of arrays and memory cells and addressing circuitry for selecting a cell in a selected one of the arrays for access. Feature select circuitry is provided for selecting an access type to be performed to the selected cell. A first bus allows for the exchange of a bit of data with the selected cell in response to the selection of a first access type. A second bus allows for the exchange of a bit of data with the selected cell in response to the selection of a second access type.

The principles of the present invention are also embodied in a system including a plurality of memory banks, a controller, a plurality of busses and a port for exchanging data with an external device. Each of the plurality of memory banks includes an array of memory cells forming a plurality of storage locations, addressing circuitry for selectively accessing a location in the array and feature select circuitry for selecting an access type to be performed to a selected location, The plurality of data buses provides for the exchange of data between the controller and a selected one of the banks, each of the busses selected in response to a selection of a corresponding access type.

The principles of the present invention are also embodied in methods of operating memories. According to one such embodiment, a method is provided for operating a memory including a plurality of arrays of memory cells, feature select circuitry for selecting an access type to be performed to a selected one of the arrays, and a plurality of busses for exchanging data with a selected one of the arrays. An access type is selected for performance to a first of the arrays using the feature select circuitry. The first array is accessed with data of a first type using a selected one of the busses associated with the access type selected for the first array. An access type is selected for performance to a second one of the arrays using the feature select circuitry. The second array is accessed using a selected one of the busses associated with the access type selected for the second array.

The principles of the present invention provides the design and implementation of an integrated circuit device which allows for the processing and storage of different types of data concurrently. This in turn provides for high bandwidth controller and/or memory operation when such a device is included in a general or special purpose computing system. Additionally, the principles of the present invention provide for an architecture which is applicable to memories of differing sizes and output word arrangements.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
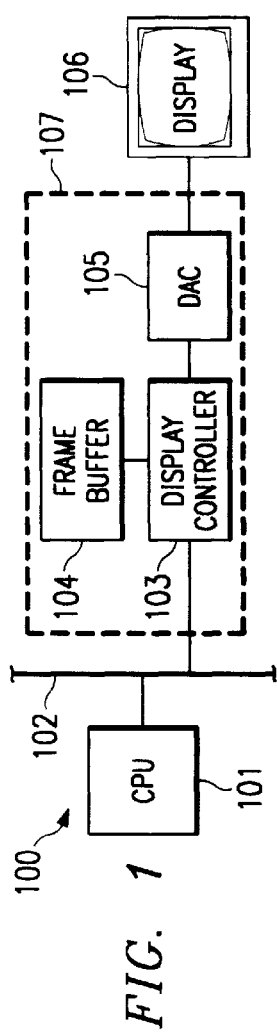
FIG. 1 is a functional block diagram of a processing system including a multiblock memory controller single chip device according to the principles of the present invention.

FIG. 1 is a high level functional block diagram of the portion of a processing system 100 controlling the display of graphics and/or video data. System 100 includes a central processing unit 101, a system bus 102, a display controller 103, a frame buffer 104, a digital to analog converter (DAC) 105 and a display device 106. According to the principles of the present invention, display controller 103 and frame buffer 104 and DAC 105 are fabricated together on a single integrated circuit chip 107.

CPU 101 controls the overall operation of system ("master") 100, determines the content of graphics data to be displayed on display unit 106 under user commands, and performs various data processing functions. CPU 101 may be for example a general purpose microprocessor used in commercial personal computers. CPU 101 communicates with the remainder of system 100 via system bus 102, which may be for example a local bus, and ISA bus or a PCI bus. DAC 105 receives digital data from controller 103 and outputs in response the analog data required to drive display 106. Depending on the specific implementation of system 100, DAC 105 may also include a color palette, YUV to RGB formal conversion circuitry, and/or x- and y-zooming circuitry, to name a few options.

Display 106 may be for example a CRT unit or liquid crystal display, electroluminescent display (ELD), plasma display (PLD), or other type of display device displays images on a display screen as a plurality of pixels. Further, display 106 may be a state-of-the-art device such as a digital micromirror device or a silicon carbide like device (as described in the January 1994 issue of the IEEE *Spectrum*)

which directly accepts digital data. It should also be noted that in alternate embodiments, "display" 106 may be another type of output device such as a laser printer or similar document view/print appliances.

Figure 2:
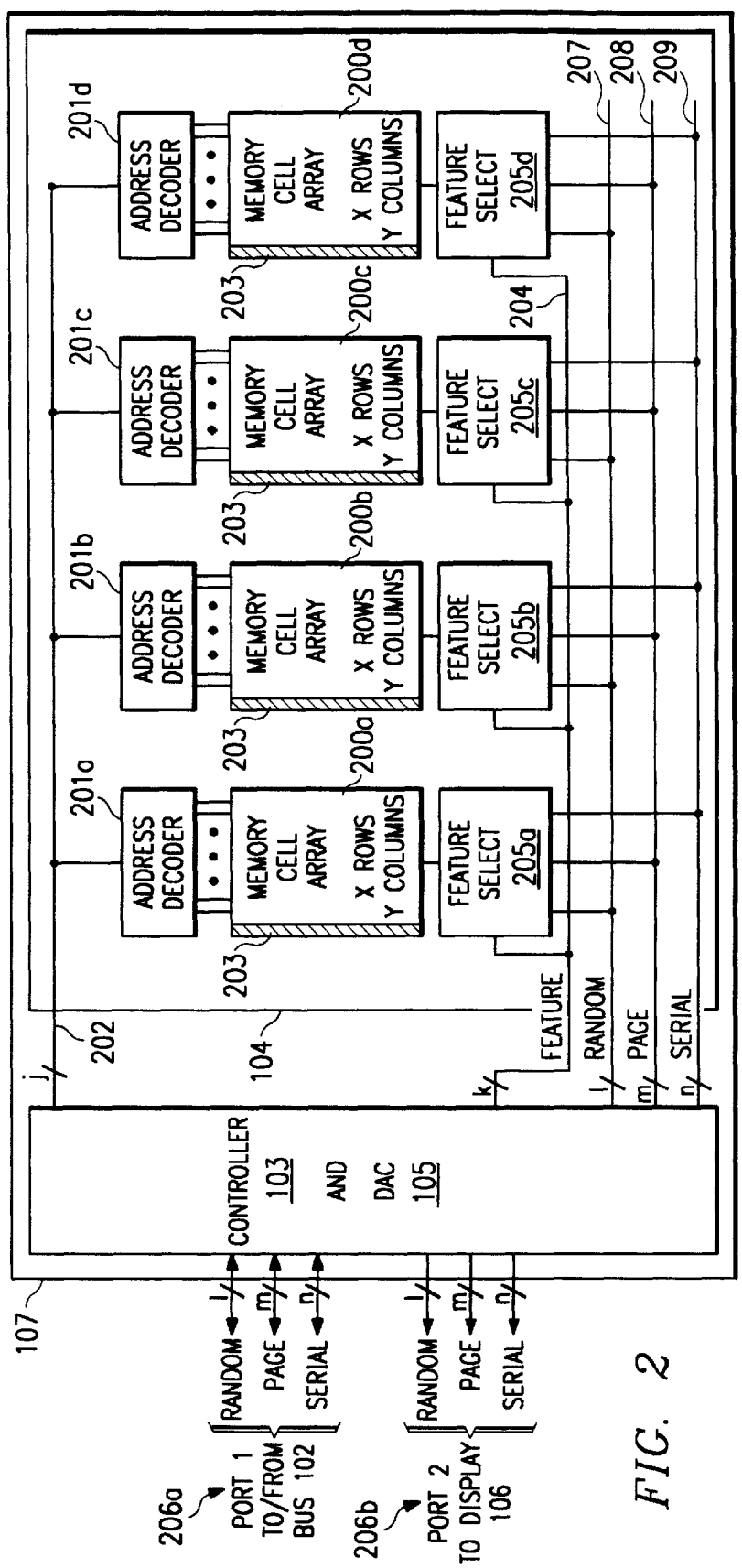
FIG. 2 is a more detailed functional block diagram of the multibank memory controller device of FIG. 1 emphasizing an architecture particularly embodying the principles of the present invention.

FIG. 2 is a block diagram depicting in further detail integrated circuit 107. In FIG. 2, both controller 103 and frame buffer 104 are disposed on integrated circuit 107 within a novel architecture embodying the principles of the present invention. It should be noted that the novel architecture of frame buffer 104 itself is constructed in accordance with the principles of the present invention and demonstrating a manner in which these can be applied to memories with or without the presence of a controller on the same chip.

In the illustrated embodiment, controller 103 is a display controller, such as a VGA controller, which among other things, controls the exchange of graphics and/or video data with frame buffer 103, controls memory refresh, and performs data processing functions such as color expansion. A display controller is the "master" for the specific application of display and thus frees up CPU 101 to perform computational tasks. Moreover, the architecture of a display controller optimizes it to perform graphics and video functions in a manner for superior to that of a general purpose microprocessor. Controller 103 may also include a color palette, cursor generation hardware, and/or video to graphics conversion circuitry, to name a few options. In embodiments employing a display controller, controller 103 could be a Cirrus Logic, Inc. controller of the 52XX or 63XX family.

Except to the extent described herein, the principles of the present invention are not dependant on the specific functional characteristics of controller 103. Thus, in alternate embodiments, controller 103 may be any one of a number of possible other general purpose microprocessor, controllers, or control devices which operate in conjunction with an associated random access memory. In general, controller 103 is a dedicated coprocessor which acquires, stores, manipulates, and outputs large arrays of data to memory. Controller 103 may be of the "bit map" class or of the "format memory" class (as described in the Apr. 18, 1994 issue of *Electronic Design*). Further, the principles of the present invention accommodate mixed-signal control devices on a single chip (die) and consequently, controller 103 may include mixed-signal drivers, clock doublers, phase-locked loops, among other things. In the preferred embodiment, controller 103 is fabricated from random logic.

It should also be recognized that the present invention is not limited to frame buffer-display controller embodiments. For example, controller 103 could also be an audio controller or DSP and the associated memory providing for audio data storage. Generally, the principles of the present invention are applicable to any single chip multiple bank memory-controller devices. For purposes of the present discussion the frame buffer-controller embodiment has been chosen as being the best for setting out the principles of the present invention.

According to the principles of the present invention, frame buffer 103 is partitioned into a selected number of memory blocks 200. In the illustrated embodiment, four memory blocks 200a–200d are provided each of which contains an array of memory cells arranged as X number of rows and Y number of columns. Each memory block is associated with an address decoder 201. Addresses of J number of bits are provided to each decoder 201 from controller 103 via a j-bit wide address bus 202. Preferably, each decoder 201/block 200 responds to a different range of addresses in the controller address space. Further, each memory block includes a number of redundant cells 203 (along with peripheral circuits such as sense amplifiers and enable/disable fuses) for repairing defective cells by substitution. In the preferred embodiment, frame buffer 104 is constructed as a dynamic random access memory (DRAM); however, the present inventive concepts are not limited to DRAMs but may be applied, in alternate embodiments, to other types of memories such as static random access memories (SRAMs), read-only memories (ROMs), electrically erasable programmable read-only memories (EEPROMs), erasable programmable read-only memories (EPROMs).

As indicated above, in the preferred embodiment, each block 200 and its associated address decoder 201 accommodate a different address range in the address space of processor 103. Further, a selected storage location within a selected block is addressed by a single address word; the ability to place controller 103 on the same chip as frame buffer 104 allows for sufficient lines to be run therebetween (without the need for level translators, and internal pins with their required spacing) such that both row and column address bits can be simultaneously presented to the address decoders 201. This feature eliminates the need for a multiplexed address bus and consequently the need to generate row address strobe (/RAS) and column address strobe (/CAS) signals.

The width of the address bus 202 is dependant on the number, size, and structure of the memory blocks 200. For example, when 256 K×16 blocks are used, each 16-bit location in a given block 200 is accessed by an 18-bit address. If 128 K×32 blocks are used, each 32-bit location is accessed by a 17-bit address and, if 64 K×64 blocks are used, each 64-bit location is accessed by a 16-bit address. In the illustrated embodiment where frame buffer 104 includes four memory blocks 200a–200d, two additional most significant bits are added to each address as block select bits. The number of clock select bits will change in alternate embodiments depending on the number of blocks 200 employed.

The row/column structure of blocks 200 is also flexible; the number of bits desired per location equals the number of rows divided by the number of columns. Further, the number of row and column address bits per each address is dependant on the respective number of rows and columns. For example, each block is arranged as 2048 rows and 128 columns to provide 256 K locations of 16 bits. The 18-bit address to each location in a block consequently includes 11 row address bits and 7 column address bits. A block 200 of 2048 rows and 64 columns will provide 128 K locations of 32 bits each and addressed by 11 row and 6 column address bits. As a final example, a block 200 arranged as 2048 rows and 32 columns will provide 64 K 64-bit locations each addressed by 11 rows and 5 column address bits. Numerous other combinations are possible.

The combination of controller 103 and frame buffer 104 on a single chip also has substantial advantages over the prior art. First, a single packaged integrated circuit takes up less board space (i.e has a smaller form factor or "footprint") than two or more packaged chips. Second, the single chip controller/memory embodiment eliminates both the number of internal and external pins normally required to electrically connect devices disposed on separate chips. According to the present invention, lines are simply run directly from circuit to circuit on the chip. Besides reducing inductive/capacitive loading on the corresponding driving circuitry, the elimination of the internal pins also allows for the chip size to be reduced and eliminates the need for the drivers normally required for chip to chip transmission. It should be noted that typically an internal pin is 50 μm wide and is spaced from neighboring pins by 50 μm. Lines directly run on the chip are typically only 1 μm wide and require only 1 μm spacing from each other. Further, because of the elimination of the pins and because the lines can be more efficiently (densely) run on a single chip, more address lines can be run from the controller to the memory. In the case of DRAMs, multiplexed address buses and the need to generate /RAS and /CAS signals are eliminated. Finally, the principles of the present invention enhance manufacturers productivity by offering "combination" solutions with one controller having various sizes of memory associated therewith—which is not possible with discrete solutions at the same cost.

For a complete description of the general operation, structure and advantages of single chip multi-bank memory-controller devices, reference is now made to co-assigned U.S. Pat. No. 5,473,573 to the same inventor and incorporated herein by reference.

According to the principles of the present invention, device 107 further embodies additional structures and functions. Specifically, a feature select bus 204, feature select blocks 205, a pair of data ports 206a and 206b (Port 1 and Port 2 respectively) and a set of internal data buses 207, 208 and 209 allow multiple banks 203 to be independently and concurrently accessed, with the accesses type (e.g. random, serial, page) selectable for a given bank at a given time. These features are particularly useful when different types of data are to be processed in single system and/or by single controller-memory subsystem. For example, in a system where multiple types display data are being processed, one block can be designated for storing VGA data, a second for 3D graphics data, and a third for MPEG data. (The inventive concept of designating separate memory blocks for different data types is not limited to display data alone; depending on the system/controller, this concept can be applied to audio data, general data and operands, etc.).

In addition to functional designation of blocks 205, an embedded controller, such as controller 103, preferably through its sequencer, is capable of optimizing the sequence of memory operations which must be performed during the concurrent processing of multiple data types. As is illustrated in the following sample, different types of data require different types of processing and hence, generally different types of memory operations. Notwithstanding, according to the inventive concepts, by appropriate segregation of data and sequencing of operations, memory and bus contention problems can be avoided and overall device speed maintained or even increased.

In the illustrated embodiment, Port 1 is coupled to bus 102 for communicating with the CPU and Port 2 is coupled to display device 106. For each port 206, 64 pins (terminals) are used for implementing random accesses to 64-bit memory locations within a given bank (array) 200, 16 pins are for page accesses of 16-bit locations along an addressed row within an addressed bank, and 1 pin is used for serial accesses. In the preferred embodiment, a dedicated set of pins are provided for each type of access. In other words, in the present example, each port will have a total of 81 data pins (i.e. 64 random access pins, 16 page access pins and 1 serial access pin). Alternatively, the pins of a given port 206 may be function multiplexed. For example, a total of 64 pins may be provided per port, with all pins used for random accesses, only a selected 16 for page accesses and only a selected one for serial accesses.

Correspondingly, in the illustrated embodiment, 64 lines 207 are provided for carrying randomly accessed data between controller 103 and banks 200, 16 lines 208 for carrying paged data, and 1 line 209 for carrying serial data. In alternate embodiments, two of one or more of the sets of lines 207, 208 or 209 may be provided such that the same type of accesses can be made substantially concurrently through both ports 206 (e.g. if two sets of lines 207 are provided, concurrent random accesses through both Ports 1 and 2 are possible).

In the illustrated embodiment, where feature select blocks 205 and feature select bus 204 allow, for a given bank 200, one of three possible access types (i.e., random, page or serial) to be selected independently, two feature select lines are provided per bank.

For purposes of the present discussion, consider the case where controller 103 is configured to control the display of VGA, MPEG and 3D graphics data, individually or in various combinations. One bank 200 is respectively designated, for example by the CPU operating system or controller 103 firmware, for storing each type of display data. Assume here that bank 200a is designated for storing VGA data, bank 200b for MPEG data and bank 200c for 3D graphics data. An additional bank 200d is shown for illustrative purposes and may be used for example for general data storage or scratch pad memory.

With regards to the processing of VGA data, the required number of random accesses to bank 205a will normally be limited. First, between 50 and 70% of the time of all VGA accesses to bank 205a will be used to support display screen refresh through Port 2. For screen refresh, data is streamed by page or serial accesses, with few, if any, of the less efficient random accesses required. During the remaining time, the accesses to bank 205a will normally be used for CPU frame (screen) updates through Port 1. In this case, the CPU writes data into the system memory defining the updated screen pixels. The source location in system memory and the destination location in frame buffer (i.e. bank 205a) are identified to controller 103. The controller in turn transfers the update data from the source location in system memory to the destination location in the VGA frame buffer, in this example bank 200a. On the next frame raster, the updated data is sent, along with the rest of the frame (or in some display systems the rest of a half frame), from the frame buffer to the display. Depending on the update, even the number of random accesses used for these system memory to frame buffer transfers can be minimized, in lieu of more efficient page or serial transfers.

In contrast, the number and type of memory operations required to support 3D graphics and MPEG displays differ substantially from those required for VGA displays. Specifically, more random accesses, read-modify-write operations and bit-block transfers are required to support the execution of the algorithms which effectuate display updates. Additionally, in 3D graphics, an additional memory plane or "z-buffer" must be defined and accessed, thus making the 3D memory operations generally more complex.

Essentially, during a basic display operation in a 3D or MPEG system, the CPU writes information to the controller directing the controller to execute one or more algorithms which generate the data required to update the frame buffer. For example, in the case of 3D graphics, the CPU may direct the controller to generate polygons on the display screen, the controller then appropriately executing the algorithms required to correspondingly update the frame buffer. In MPEG, the CPU may direct the controller to update blocks of pixels on the screen to simulate object motion. The controller may then, for example, execute bit-block transfers algorithms in order to appropriately modify the corresponding data in the MPEG frame buffer. Once the algorithm execution is complete and the frame buffer is updated, the updated data is rastered to the display.

In sum, the execution of algorithms in the MPEG and 3D graphics cases results in the need for the execution of substantially more random accesses than in the VGA case. Additionally, it is important to recognize that, in contrast to the VGA case where updates normally appear on the screen during the next raster scan after the system memory to frame buffer transfer, in the MPEG and 3D graphics cases, updates may not appear on the screen for two or more frames after the CPU initiates the update. During this time the controller executes the update algorithms. Thus, not only does the controller require independent memory to support the execution of the update algorithm, but also a means by which the screen 3D and/or MPEG refresh can be sustained during algorithm execution.

The multibank memory architecture of the present invention, which allows partitioning of different types of data into different parts of memory, advantageously provides for optimized memory use in such scenarios. While less efficient random accesses are being performed to one bank 200, a higher speed page or serial access can concurrently be made to another bank 200. For example, while data is being rastered out of any block 200 through a selected port 206 to support display update/refresh, controller 103 can itself be accessing one or more of the other banks 200 as required to execute a algorithm or transfer data from system memory. Many other combinations are possible. This feature is further enhanced since two ports 206 are provided which allow controller 103 to simultaneously exchange data with two external devices. In this case, refresh information can be input for the update of one bank 200 while screen refresh is supported by another.

Controller 103, preferably through its embedded sequencer, sequences the required accesses to banks 200 to optimize performance. Since, as discussed in detail above, /RAS and /CAS signals, either from an external source or internally, are not required the timing constraints on the memory operations are much less severe than in conventional memory systems. This advantageously gives controller 103 the ability to time the refresh/precharge of DRAM banks 200 such that one or more banks can be refreshed or precharged while one or more other banks are accessed. For example, VGA screen refresh can be supported by streaming from bank 200a through Port 2 while either bank 200b, 200c, or both, are sent into DRAM array refresh or precharge.

Although the present invention and its advantages have been described in detail, it should be understood that various changes, substitutions and alterations can be made herein without departing from the spirit and scope of the invention as defined by the appended claims.

What is claimed is:

1. A memory architecture comprising:
   a plurality of arrays of memory cells;
   addressing circuitry for selecting a cell in a selected one of said arrays for access;
   feature select circuitry for selecting an access type to be performed to said selected cell said access type selected from the group consisting of random, page and serial accesses;
   a first bus for exchanging a bit of data with said selected cell in response to a selection of a first said access type; and
   a second bus for exchanging a bit of data with said selected cell in response to a selection of a second said access type.

2. The memory architecture of claim 1 and further comprising a feature select bus coupled to said feature select circuitry for effectuating selection of a said access type, a width of said feature select bus preselected in accordance with a number of available access types.

3. The memory architecture of claim 1 wherein said addressing circuitry comprises a plurality of blocks, each said block associated with a preselected one of said arrays.

4. The memory architecture of claim 1 wherein said feature select circuitry comprises a plurality of blocks, each said block associated with a preselected one of said arrays.

5. The memory architecture of claim 1 wherein at least one of said arrays comprises an array of random access memory cells.

6. A system comprising:
   a plurality of memory banks each comprising:
      an array of memory cells forming a plurality of storage locations;
      addressing circuitry for selecting for access a said location in said array; and
      feature select circuitry for selecting an access type to be performed to a selected location, said access type selected from the group consisting of random, page and serial accesses;
   a controller;
   a plurality of data buses for exchanging data between said controller and a selected one of said banks, a one of said buses selected in response to a selection of a corresponding access type; and
   a port for exchanging data with an external device.

7. The system of claim 6 wherein said plurality of banks are disposed on a single chip.

8. The system of claim 6 wherein said controller and said plurality of banks are disposed on a single chip.

9. The system of claim 6 wherein said port comprises a plurality of sets of terminals, each said set of terminals selected in response to a selection of a corresponding said access type.

10. The system of claim 6 and further comprising a feature select bus coupled to said feature select circuitry of each said bank for controlling the selection of said access type, a width of said feature select bus proportional to a number of available access types.

11. The system of claim 6 and further comprising a second port for exchanging data with an external device and comprising a plurality of sets of terminals, each said set of terminals selected in response to a selection of a corresponding said access type.

12. The system of claim 6 wherein said controller comprises a display controller and at least one of said banks forms a display frame buffer.

13. A method for operating a memory including a plurality of arrays of memory cells, feature select circuitry for selecting an access type to be performed to a selected one of the arrays, and a plurality of buses for exchanging data with a selected one of said arrays, the method comprising the steps of:

selecting an access type from the group consisting of random, page and serial accesses, for performance to a first of the arrays using the feature select circuitry;

accessing the first array with data of a first type using a selected one of the buses associated with the access type selected for the first array;

selecting an access type for performance to a second one of the arrays using the feature select circuitry; and accessing the second of the arrays using a selected one of the buses associated with the access type selected for the second array.

14. The method of claim 13 wherein said step of accessing the first array and said step of accessing the second array are performed substantially concurrently.

15. The method of claim 13 wherein the first type of data is selected from the group consisting of VGA, MPEG and 3D graphics data.

16. The method of claim 13 wherein the second type of data is selected from the group consisting of VGA, MPEG and 3D graphics data.

17. The method of claim 13 and further comprising the step of exchanging data between the memory and an external device through a port including a plurality of sets of terminals a set of terminals selected in accordance with a corresponding selected type of access.

18. The method of claim 13 and further comprising the step of exchanging data between the memory and a controller coupled to the plurality of buses.

* * * * *